United States Patent [19]

Rager

[11] Patent Number: 4,843,711

[45] Date of Patent: Jul. 4, 1989

[54] DEVICE FOR PLACING COMPONENTS IN PARTICULAR ON CIRCUIT BOARDS

[75] Inventor: Hans Rager, Boeblingen, Fed. Rep. of Germany

[73] Assignee: International Business Machines Corporation, Armonk, N.Y.

[21] Appl. No.: 229,582

[22] Filed: Aug. 8, 1988

[30] Foreign Application Priority Data

Nov. 5, 1987 [DE] Fed. Rep. of Germany ....... 3737506

[51] Int. Cl.[4] .............................................. H05K 3/30
[52] U.S. Cl. ........................................ 29/740; 29/743; 29/759; 294/64.1
[58] Field of Search ................. 29/740, 743, 759, 840; 294/64.1, 2; 414/744 B

[56] References Cited

U.S. PATENT DOCUMENTS 4,653,664  3/1987  Hineno et al. ..................... 29/759 X
4,754,545  7/1988  Elliot ..................................... 29/740

Primary Examiner—Carl E. Hall
Attorney, Agent, or Firm—Robert M. Carwell

[57] ABSTRACT

A device for placing components (37) on circuit boards, comprising a turret (6) rotatable about an axis (5), which by a robot arm (2), using control means, is movable between a pick-up and a placement postion. The turret (6) picks up components (37) by a plurality of pick-up members (13), retains them by vacuum in a component centering means (27), which may be recessed, and assembles them at target positions, with a suction channel (suction tube 28), connectable to a vacuum source, and termininating in the component centering means (27). One of the pick-up members (13) is movably guided in the turret (6) between at least one extended pick-up/placement positions and one retracted holding/transport position, while the other pick-up members (13) in the turret (6) are kept in a transport or an inoperative position. In the holding/transport position, the suction channel is permanently connected to the vacuum source. In the pick-up position, said suction channel is also connected to a vacuum source and, in the placement position, said suction channel is disconnected from the vacuum source.

21 Claims, 2 Drawing Sheets

DEVICE FOR PLACING COMPONENTS IN PARTICULAR ON CIRCUIT BOARDS

DESCRIPTION

1. Technical Field

This invention relates to electronic apparatus manufacturing systems and, more particularly, relates to apparatus for placement of electronic components on circuit boards.

2. Background Art

The invention concerns a device for placing components in particular on circuit boards, comprising a turret rotatable about an axis, which by a robot arm, using control means, is movable between a pick-up and a placement position in which the turret is capable of picking up components by a plurality of pick-up members, keeping them by vacuum in a component centering means, which may be recessed, and assembling them at target positions, with a suction channel, connectable to a vacuum source, terminating in the component centering means.

A device known from U.S. Pat. 4,587,703 permits a plurality of identically shaped components to be picked up and assembled simultaneously. During assembly, the entire turret is moved up and down. As a result, the moved mass is relatively large, so that relatively high motional forces are required and the various mechanical components have to be rigidly designed, leading to a high constructional weight. The components have to be assembled in a particular pattern, and only identical components can be assembled, so that this known device is not universally applicable.

DISCLOSURE OF THE INVENTION

It is therefore an object of the present invention to improve a device of the previously described kind such that different components can be individually assembled at target positions, with the assembly paths being as short as possible ad the weight to be moved being low.

According to the invention, this object is accomplished by one of the component pick-up members being movably guided in the turret between at least one extended pick-up/placement position and one retracted holding/transport position, while the other pick-up members in the turret are kept in a transport or an inoperative position, in the holding/transport position, the suction channel being permanently connected to the vacuum source, in the pick-up position, said suction channel being also connected to a vacuum source, and, in the placement position, said suction channel being disconnected from the vacuum source. As each pick-up member is individually movable in the turret, different components can be individually seized, buffered, and then deposited or assembled one after the other at the assembly position. For this purpose, the pick-up members may be differently designed to accommodate different components, selecting the pick-up member required for a particular component by suitable control means. The individual components supplied need not be sorted but, if suitably coded, may be presented in random order. For pick-up and assembly, only the respective pick-up member, rather than the entire robot arm and turret, has to be moved, so that only small masses have to be accelerated or decelerated. Therefore, the robot design may be simplified while maintaining a high operating speed.

The suction channel may be advantageously formed by a suction tube which is axially movable by a piston between a retracted holding position and a pick-up and placement position in which the free end of the tube extends beyond the component centering means. The end of the movable suction tube controls the components at limited force, so that they are seized by vacuum. If a component covers the free end of the suction tube, the vacuum increases, with the suction tube being retracted by the piston and the component resting in the centering means where it is reliably held by the vacuum and from where it may be transferred, retaining its position even at high vibrational forces.

To reduce the weight, each pick-up member may be designed in the form of a hollow sleeve and movably guided in an associated guide hole of the turret. The turret is provided with two spaced ducts terminating in the associated guide hole. Each pick-up member is also provided with an opening which in the retracted holding/transport position of the pick-up member and in the extended pick-up/placement position interacts respectively with the upper and the lower one of the two ducts such that the inside of the pick-up member is connected to one of the ducts, depending upon its position in the turret.

A particularly simple control is obtained by providing the turret with two ducts starting at a central annular duct, the upper one of the annular ducts and thus all upper ducts being permanently connected to the vacuum source, and the lower one of the annular ducts and thus all lower ducts being connected by a reversing valve to a vacuum or a pressure source. The vacuum source is active during pick-up, buffering and transport, whereas the pressure source is activated by the valve only in the assembly position, so that the component to be assembled is readily and reliably released.

To reduce the weight, the turret may also take the form of a circular cone, with the guide holes for the pick-up members being symmetrically distributed transversely parallel to the turret surface. Sixteen uniformly distributed pick-up members, for example, may be concentrically arranged in the turret, so that in a single pick-up motion of the robot arm sixteen components can be seized and fitted in the assembly position after the arm has swung back. By accurate control and slight positional adjustments of the turret, components may be picked from and assembled at target positions.

To reduce the weight, the turret may be pivotably supported on a guide bolt comprising two axial connecting ducts for the vacuum and the pressure supply of the pick-up members. The axial movement of the pick-up members in their guide holes may be limited by stops, preferably by a stop pin guided in a longitudinal slot, which additionally serves as a torsion protection means. The axial movement of the pick-up members in their guide holes may also be limited by an escapement ring, so that the pick-up members are not displaced by their own weight or vibration. The escapement force may be between about 100 and 150 Pond. For adjusting a pick-up member in the turret, a ram may be movably guided in a carrier head, the ram and the pick-up member being detachably coupled to each other to ensure that the pick-up member is accurately adjusted. Ram and associated pick-up member may be detachably coupled by an ON/OFF electromagnet which preferably forms an integral part of the ram. The ram itself may be movable under control of an electric motor, using, for example, a stepper motor, a gear unit, a gear, a pinion or a pivotable threaded rod.

To reduce the weight, the pick-up member may also have a tapered head portion, at whose end the component centering means is arranged.

The piston itself is movably guided in the head portion, unilaterally supporting the suction tube, the free end being positioned in a recessed hole terminating in the component centering means. The end of the suction tube is guided in the reduced diameter portion of the recessed hole and a vent terminates in the unreduced diameter portion of the recessed hole, so that when the piston is withdrawn by vacuum, no vacuum is formed in the recessed hole. The piston movement is limited by a stop pin. The suction channel may be advantageously sealed by a return valve, so that in at least a portion of the suction channel there is a unidirectional flow (namely, in the direction in which the vacuum is bled off). The return valve is suitably provided in the piston, preferably in the form of a sphere located in a recessed axial hole, with the recess interacting with the sphere as a sealing surface preventing a flow in the suction tube in the direction of the free end.

The actual assembly of the component is effected by means of compressed air. The compressed air is applied to the inside of the pick-up members, moving the piston and thus the suction tube downwards. During this downward movement, the vacuum remains active in the suction tube, so that the component is retained at the free end of the suction tube. The suction tube itself then emerges from the component centering means, forcing the component to be assembled against the circuit board, where it is fixed, using, for example, a soldering agent. The return valve ensures that the compressed air does not escape downwards, which might lead to adjacent components already assembled being blown away. The adhesion of the components fixed by soldering paste or other adhesives is such that the components adhere to the circuit board and that the suction tube, despite the effect of the vacuum, may be removed from the assembled components by withdrawing the pick-up members by means of the ram.

The piston carrying the suction tube is favorably biased and movably supported in the head portion at a predetermined automatic locking force. This permits limiting the force at which the components are assembled, thus eliminating additional measures and avoiding damage to the components to be assembled.

To save energy, the two associated ducts of the turret may be sealed by the walls of the pick-up members in a central neutral position of the latter, so that there is no connection to the vacuum or the pressure source. In this neutral position, pick-up members not used are kept in place in the turret by their inherent friction and, if necessary, by the additional defined effect of an escapement ring.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

BEST MODE FOR CARRYING OUT THE INVENTION

Figure 1:
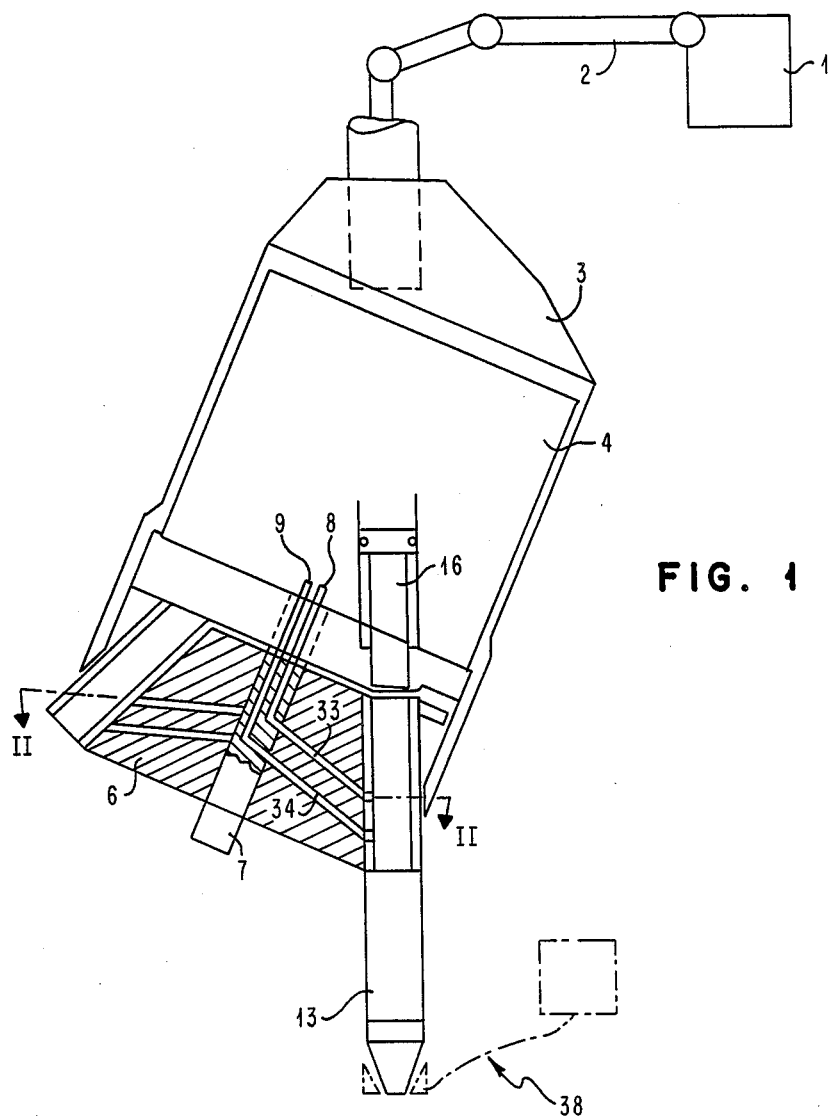
FIG. 1 is a schematic view of a placement device.
Figure 2:
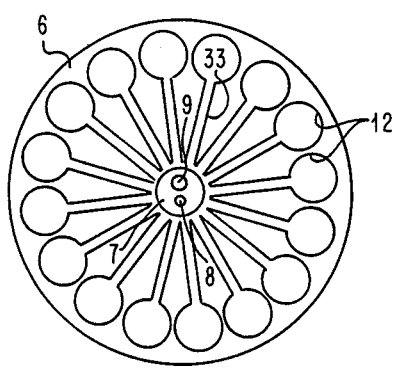
FIG. 2 is a simplified sectional view of a turret along line II—II in FIG. 1.

The placement device shown in the schematized view of FIG. 1, which is used in particular for circuit boards, consists of a robot 1 with control means, and a robot arm 2 having an assembly unit 3 attached to its end. The assembly unit 3 is provided with a carrier head 4 and a turret 6 rotatable about an axis 5. Carrier head 4 is provided with a guide bolt 7 supporting the turret 6 and comprising two connecting ducts 8, 9 located in longitudinal holes. The connecting duct 8 is permanently connected to a vacuum source (not shown in detail), whereas the connecting duct 9, through a valve 10, is optionally connected to the above-mentioned vacuum source or to a compressed-air source (not shown either).

The turret 6 has a circular conical shape and is provided at its surface 11 with guide holes 12 which for the sixteen pick-up members 13 of the embodiment are distributed along the circumference. The pick-up members 13 are movably guided in the guide holes 12, the end positions being limited in each case by a longitudinal stop slot 14 and a stop pin 15. The stop pin 15 simultaneously serves as a torsion protection means. In carrier head 4, a ram 16 is movably guided by an electric motor in the direction of the guide hole 12 and may be magnetically coupled to an associated pick-up member 13 by means of a holding magnet 17. Speed-dependent adjustment of the pick-up member 13 between the pick-up/placement position and the holding/transport position (shown respectively on the right and the left of FIG. 3) is possible only in a position of the turret 6 in which the pick-up member 13 is in alignment with ram 16. For this purpose, turret 6 may be accurately rotationally positioned, with the control means selecting the respective pick-up member 13 to be moved, and the remaining pick-up members 13 in turret 6 retaining their position predetermined by the ram 16. To prevent any displacement in the guide hole 12, the circumference of pick-up member 13 is provided with an escapement ring 18 which acts as a predetermined stop of, say, between 100 and 150 Pond.

The pick-up member 13 is designed as an essentially hollow sleeve with an opening 19 in the form of a slot facing the turret 6. Piston 21 is movably guided in a head portion 20, with a gasket 22 requiring a minimum displacement force of between 50 and 100 Pond. The piston 21 is movable between a stop pin 23 and a recess 24. In addition, stop pin 23 secures the upper portion of pick-up member 13 and the head portion 20. A recessed axial hole 25 is provided adjacent to recess 24 in alignment with axis 26 terminating in a component centering means 27 at the end of pick-up member 13. The component centering means 27 may be shaped to suit the components to be assembled.

Projecting one side of the piston, a suction tube 28 is concentrically arranged in piston 21. In the pick-up and placement position (shown on the right at the bottom of FIG. 3), the free end 29 of the suction tube 28 extends beyond the component centering means 27, whereas in the retracted holding position (shown on the left in FIG. 3), piston 21 rests against stop pin 23. The space 30 below the piston 21 is directly connected to the environment by means of a vent 25', so that piston 21 can readily perform a stroke of about 2 mm.

The piston 21 also comprises a return valve 31 in the form of a spherical valve which permits a flow in the suction tube 28 in the direction of the inside 32 of the pick-up member 13 but not in the opposite direction.

In turret 6, ducts 33 and 34, terminating in an annular duct 35 and 36, respectively, are arranged in pairs. Through a transverse hole, annular duct 36 is linked with the connecting duct 9 and through another transverse hole, annular duct 35 is linked with the connecting duct 8.

Figure 3:
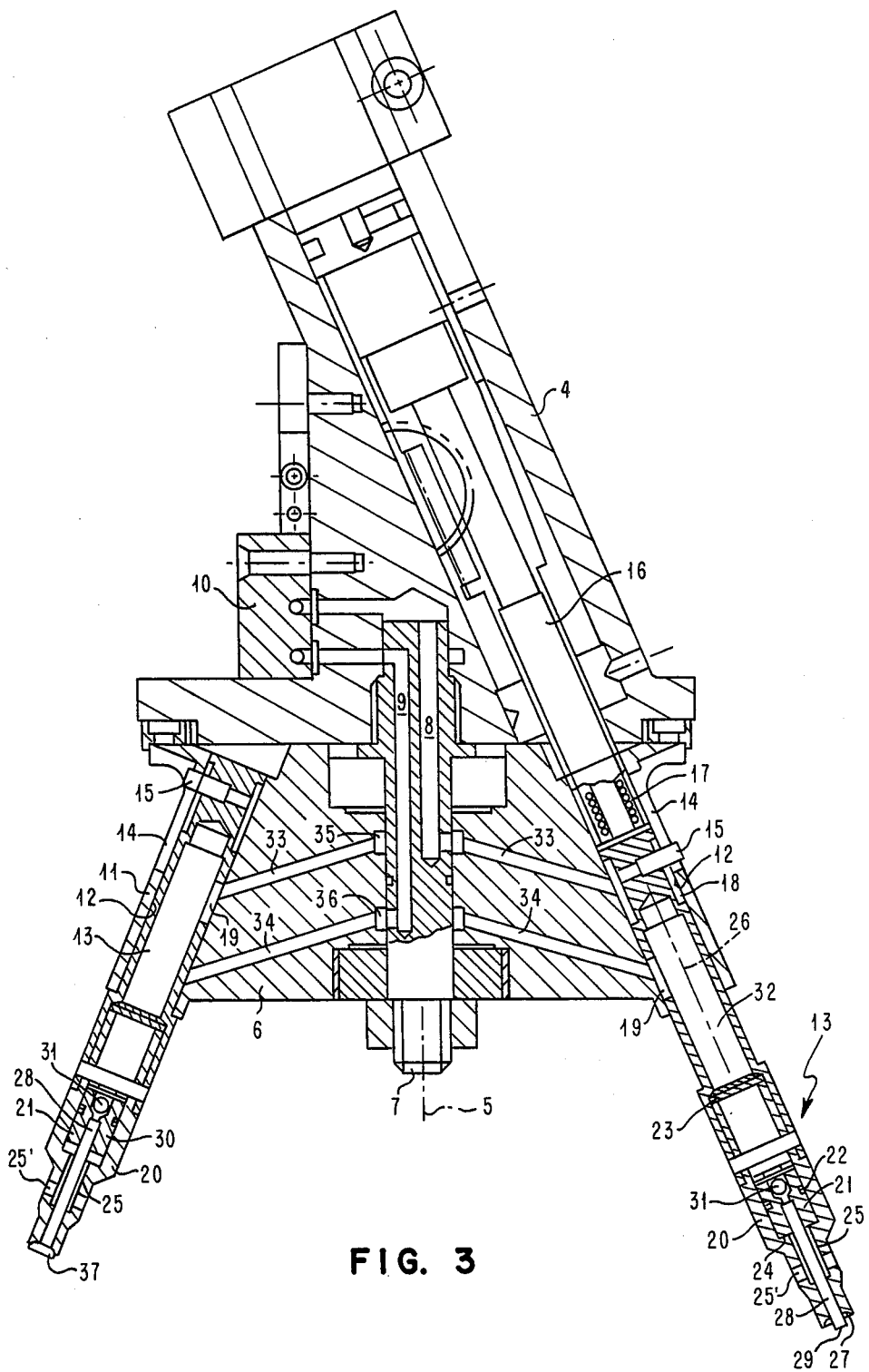
FIG. 3 is a sectional view of a turret with two pick-up members in different operational positions on an enlarged scale.

Through the connecting duct 8, the annular duct 35 and the upper ducts 33, the inside 32 of all pick-up members 13 in the holding/transport position is permanently connected to a vacuum source, so that the vacuum through the piston 21 and the suction tube 28 causes components 37 to be sucked against the component centering means 27, reliably securing them, as shown on the left in FIG. 3.

In the pick-up/placement position (on the right in FIG. 3), the free end 29 of the suction tube 28 is connected to the annular duct 36 by the piston 21, the inside 32, the opening 19, and the lower duct 34. Annular duct 36 in turn is linked through the connecting duct 9 with a vacuum source (not shown in detail). The vacuum leads to a component 37 (not shown) to be picked up. To ensure that the components 37 are handled with care, the speed of the pick-up members 13 is predetermined such that the component to be picked up is approached gently by the suction tube 28. The free end 29 of the suction tube 28 is sealed by the picked up component 37 so that the increasing vacuum at the inside 32 causes the piston 21 to be moved upwards. As a result, the picked up component 37 is pulled by the suction tube 28 into the component centering means 27 where it is retained by vacuum. Then, the ram 16 moves the pick-up member 13 to the holding/transport position (shown on the left in Fig. 3).

Conversely, for placing components on a circuit board after the carrier head 4 has approached the placement position on the circuit board, the control means of robot 2 cause ram 16 to be moved downwards, so that the component to be assembled (not shown in FIG. 3) is moved to its assembly position. Then, valve 10 is switched and compressed air, introduced in the duct 9, is fed to the inside 32 through the annular duct 36, the lower duct 34, and the opening 19, moving the piston 21 downwards. The increasing vacuum seals the return valve 31, so that no compressed air can escape to the outside through suction tube 29 and blow away components already placed. The components are fixed to the circuit boards by a soldering agent or other adhesives such that, regardless of the vacuum still existing, they may be readily separated from the free end 29 of the suction tube 28 projecting the centering means 27. The projecting free end 29 of the suction tube 28 presses the component to be assembled firmly against the circuit board, the pick-up member 13 being subsequently moved by the ram 16 to an inoperative position (not shown) in which opening 19 is positioned between the ducts 33 and 34, so that these ducts are sealed by the wall of the pick-up member 13 and there is practically no leakage. After all components 37 have been assembled, the carrier head 4 returns to a pick-up station to receive fresh components 37. Thus, in one operating cycle, a group of sixteen components 37 can be assembled, with the paths travelled being reduced to a minimum.

For accurately approaching the assembly position, an optical system (marked by dash-dotted lines in Fig. 1) may be provided, by which the accuracy is considerably increased even at large dimensional tolerances.

While the invention has been shown and described with reference to particular embodiments thereof, it will be understood by those skilled in the art that the foregoing and other changes in form and details may be made therein without departing from the spirit and scope of the invention.

I claim:

1. Apparatus for placing components on circuit boards, comprising:
    a turret rotatable about an axis;
    a vacuum source; and
    a plurality of pick-up members carried by said turret, each having
        a component centering means; and
        a suction channel terminating at said component centering means;
        and each of said plurality of pick-up members being movably guided in a respective guide hole in said turret between
            at least one extended pick-up/placement position; and
            one retracted holding/transport position
        while remaining ones of said pick-up members are in an inoperative/transport position;
        wherein when said each pick-up member is in said holding/transport position a respective said suction channel is connection to said vacuum source; and
        further wherein when said each pick-up member is alternately in said pick-up or placement position, said respective suction channel is alternately connected to and disconnected from said vacuum source, respectively.

2. The apparatus of claim 1 further including
    a suction tube defining said suction channel and a free end;
    piston means for axially moving said tube between said retracted holding/transport position and said extended pick-up/placement position, wherein said free end projects outwards of said component centering means.

3. The apparatus of claim 2 wherein said turret defines a plurality of guide holes each receiving and movably guiding a respective one of said pick-up members; wherein for each said pick-up member said turret further defines a pair of ducts terminating in one of said guide holes; wherein said each pick-up member further includes an inside and an opening; and further wherein when said each pick-up member is alternately in said pick-up/placement and said holding/transport positions, said opening interacts with a different respective one of said ducts and links said inside with said different duct.

4. The apparatus of claim 3 further including valve means interconnected to said vacuum source or a pressure source; and wherein said turret further defines upper and lower central annular ducts,
    said upper central duct being interconnected to an upper of said pair of ducts for said pick-up members and to said vacuum source,
    said lower central duct being interconnected to a second of said pair of ducts; and said lower duct and said second duct being further interconnected to said valve means.

5. The apparatus of claim 4 wherein said turret defines a substantially conically-shaped outer surface; and said guide holes are symmetrically distributed about said axis and parallel to said outer surface.

6. The apparatus of claim 5 further including guide bolt means in co-axial alignment with said axis for pivotably guiding said rotation of said turret thereabout; and wherein said guide bolt means includes a pair of axially connecting ducts.

7. The apparatus of claim 3 further including for each said pick-up member
a longitudinal stop slot; and
a stop means guided in said stop slot for limiting axial movement of said pick-up member.

8. The apparatus of claims 3 or 7 further including a plurality of escapement ring means, each said ring means being for limiting axial movement of respective ones of said pick-up members in said guide holes.

9. The apparatus of claim 3 further including
a carrier head;
a RAM movably guided within and by said carrier head and detachably coupled to a preselected one of said pick-up members, whereby said preselected member is axially moved in a respective said guide hole.

10. The apparatus of claim 9 further including a variable holding magnetic means for said detachable coupling of said RAM in said preselected pickup member.

11. The apparatus of claim 10 further including an electric motor interconnected to said RAM for said movable guiding of said RAM within said carrier head.

12. The apparatus of claim 4 wherein each said pick-up member includes a tapered head portion having an end including a respective one of said component centering means.

13. The apparatus of claim 12 wherein said piston means is movably guided in said head portion; said suction tube is disposed in said piston means with said free end of said tube in a recessed axial hole having a reduced diameter portion terminating in said centering means; and wherein when each of said plurality of pick-up members is disposed in said pick-up/placement position, a corresponding said suction tube is guided in said reduced diameter portion of said hole and extended into said component centering means; and further when said plurality of pick-up members is disposed in said retracted holding/transport position, said suction tube is at least in alignment with said component centering means or retracted within said hole.

14. The apparatus of claim 2 or 13 further including return valve means for sealing said suction channel of said suction tube.

15. The apparatus of claim 14 wherein said return valve means is disposed within said piston and includes a sphere disposed in said recessed axial hole, said sphere sealingly engaging with said recess of said hole to prevent fluid flow within said suction tube in the direction of said free end.

16. The apparatus of claim 15 further including means for introducing compressed fluid into each said inside of said pick-up member when in said pick-up/placement position, whereby a respective said piston and suction tube of said pick-up member are urged in the direction of a respective said component centering means, and whereby a component disposed in said component centering means is urged by said free end away from said centering means into assembly on said circuit board.

17. The apparatus of claim 16 further including biasing means for biasing and movably guiding said piston means in said carrier head at a predetermined automatic locking force.

18. The apparatus of claim 17 wherein said automatic locking force is about 50 Pond.

19. The apparatus of claim 18 wherein said each pick-up is movably guidable in said respective guide hole to a central inoperative position intermediate said pick-up/placement position and said holding/transport position; wherein each said pick-up member defines an outer wall; and wherein said pair of ducts are sealed by said outer wall of said each pick-up when in said intermediate position.

20. The apparatus of claim 11 rwherein each said pick-up member is sequentially moved to said inoperative position after said component is disposed on said circuit board, thence to said pick-up/placement position, and thence to said holding/transport position.

21. The apparatus of claim 20 further including optical system means adjacent said component centering means for detecting presence and absence of said component within said component centering means.

* * * * *